(12) United States Patent
Masuda et al.

(10) Patent No.: US 7,777,664 B2
(45) Date of Patent: *Aug. 17, 2010

(54) WAVE ABSORBER

(75) Inventors: Yoshiyuki Masuda, Tokyo (JP); Noboru Otani, Tokyo (JP); Hisamatsu Nakano, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 133 days.

This patent is subject to a terminal disclaimer.

(21) Appl. No.: 11/574,701

(22) PCT Filed: Aug. 31, 2005

(86) PCT No.: PCT/JP2005/015865

§ 371 (c)(1),
(2), (4) Date: Mar. 5, 2007

(87) PCT Pub. No.: WO2006/027978

PCT Pub. Date: Mar. 16, 2006

(65) Prior Publication Data

US 2007/0247349 A1 Oct. 25, 2007

(30) Foreign Application Priority Data

Sep. 6, 2004 (JP) ............................. 2004-258182

(51) Int. Cl.
*H01Q 17/00* (2006.01)

(52) U.S. Cl. .......................................................... 342/1

(58) Field of Classification Search ....................... 342/1
See application file for complete search history.

(56) References Cited

U.S. PATENT DOCUMENTS 4,621,012 A    11/1986   Pusch (Continued)

FOREIGN PATENT DOCUMENTS

EP    1 720 396 A1    11/2006

(Continued)

OTHER PUBLICATIONS

International Searching Authority Search Report in Application No. PCT/JP05/015865 dated Nov. 30, 2005.

(Continued)

*Primary Examiner*—Thomas H Tarcza
*Assistant Examiner*—Timothy A Brainard
(74) *Attorney, Agent, or Firm*—Wood, Herron & Evans, L.L.P.

(57) ABSTRACT

A wave absorber of the present invention includes a sequentially laminated structure including an conductor layer (11) made of a conductive material; a first dielectric layer (polycarbonate substrate (12) and bismaleimide-triazine substrate (13)) made of one layer or a multilayer of a dielectric material; and a patterned layer (14) including a plurality of a pattern made of the conductive material, wherein the conductor layer, the first dielectric layer, and the patterned layer are laminated sequentially, and each pattern in the patterned layer (14) is different from other adjacent patterns with respect to at least one of size and shape. Therefore, the wave absorber has sufficient reflection-attenuating capability to prevent communication failure caused by a reflection of a radio wave and so on, can be thin-sized and reduced in weight, and has a wide-band attenuation property.

10 Claims, 13 Drawing Sheets

U.S. PATENT DOCUMENTS

| | | | |
|---|---|---|---|
| 4,726,980 | A | 2/1988 | Ishikawa et al. |
| 4,728,980 | A | 3/1988 | Nakamura et al. |
| 4,948,922 | A * | 8/1990 | Varadan et al. ............. 174/353 |
| 5,214,432 | A * | 5/1993 | Kasevich et al. ................ 342/3 |
| 5,358,787 | A | 10/1994 | Fontana et al. |
| 5,455,116 | A | 10/1995 | Nagano et al. |
| 5,561,428 | A * | 10/1996 | Czaja et al. .................... 342/1 |
| 5,576,710 | A * | 11/1996 | Broderick et al. .............. 342/1 |
| 5,812,080 | A | 9/1998 | Takahashi |
| 5,885,692 | A | 3/1999 | Imashiro et al. |
| 5,961,893 | A | 10/1999 | Honda et al. |
| 6,207,003 | B1 | 3/2001 | McClure et al. |
| 6,657,005 | B1 | 12/2003 | Nishihata et al. |
| 2003/0011306 | A1 | 1/2003 | Bechtel et al. |
| 2003/0044623 | A1 | 3/2003 | Sakurai et al. |
| 2003/0107025 | A1 | 6/2003 | Okayama et al. |
| 2004/0021597 | A1 | 2/2004 | Dvorak et al. |
| 2004/0094750 | A1 | 5/2004 | Widagdo et al. |
| 2004/0160486 | A1 | 8/2004 | Kim |
| 2004/0189612 | A1 | 9/2004 | Bottari et al. |
| 2005/0001780 | A1 * | 1/2005 | Aisenbrey ................... 343/873 |
| 2007/0183066 | A1 | 8/2007 | Varaprasad et al. |

FOREIGN PATENT DOCUMENTS

| | | |
|---|---|---|
| EP | 05 77 6813 A1 | 11/2006 |
| GB | 2 336 472 A | 10/1999 |
| JP | 05-335832 | 12/1993 |
| JP | 06-045782 | 2/1994 |
| JP | 06 085532 A | 3/1994 |
| JP | 6-140787 | 5/1994 |
| JP | 06-244583 | 9/1994 |
| JP | 10-51180 | 2/1998 |
| JP | 11-163585 | 6/1999 |
| JP | 11-330775 | 11/1999 |
| JP | 2000-68677 | 3/2000 |
| JP | 2001-308584 | 11/2001 |
| JP | 2001-339192 | 12/2001 |
| JP | 2001-352191 | 12/2001 |
| JP | 2002076670 | 3/2002 |
| JP | 2002-246786 | 8/2002 |
| JP | 2002314284 | 10/2002 |
| JP | 2002-368479 | 12/2002 |
| JP | 2003069278 | 3/2003 |
| JP | 2003209388 | 7/2003 |
| JP | 2003 243876 A | 8/2003 |
| JP | 2003258483 | 9/2003 |
| JP | 2004-63719 | 2/2004 |
| JP | 2004-356325 | 12/2004 |
| JP | 2005-079247 | 3/2005 |
| WO | 94/24724 A1 | 10/1994 |
| WO | 98/31072 A1 | 7/1998 |
| WO | 2004009352 A1 | 1/2004 |

OTHER PUBLICATIONS

European Patent Office, Partial European Search Report in Application No. PCT/JP2005/015865 dated Aug. 29, 2007.

European Patent Office, European Search Report in corresponding EP Application Serial No. 09157555.5-1248 issued Sep. 23, 2009, 10 pages.

Japanese Patent Office, Office Action in counterpart JP Application Serial No. 2004-258182 issued on Jul. 14, 2009, 9 pages.

Japanese Patent Office, Office Action in counterpart JP Application Serial No. 2004-265233 issued on Jul. 14, 2009, 12 pages.

Japanese Patent Office, Notice of Allowance in counterpart JP Application Serial No. 2004-371225 issued on Aug. 18, 2009, 6 pages.

European Patent Office, Supplementary European Search Report in Application No. PCT/JP2005/003194 dated Sep. 4, 2007.

International Searching Authority/Japan, Search Report and Written Opinion in Application Serial No. PCT/JP2005/003194, May 24, 2005, 15 pages.

U.S. Patent and Trademark Office, Non-Final Office Action received in related U.S. Appl. No. 10/598,345 dated Jul. 21, 2009, 42 pages.

Chinese Patent Office. Chinese Office Action in counterpart CN Application Serial No. 200580005924.X issued Jan. 8, 2010, 12 pages.

* cited by examiner

WAVE ABSORBER

TECHNICAL FIELD

The present invention relates to a wave absorber. Also, the present invention relates to a method for absorbing waves and a wave absorber which is capable of preventing communication failure due to reflection of electromagnetic (EM) waves and the like and of being thin-sized and reduced in weight.

Priority is claimed on Japanese Patent Application No. 2004-258182, filed Sep. 6, 2004, the content of which is incorporated herein by reference.

BACKGROUND ART

In recent years, development of wireless communication systems including a mobile telephone, a wireless LAN (Local Area Network), and ITS (Intelligent Transport Systems) has caused the need for protection of communication information and for prevention of radio interference and false communication. When the main purpose is protection of communication information, each of indoor and outdoor radio waves is isolated by using an electromagnetic wave-shielding material so as to shield each of a foreign radio wave and a radiated wave from a communication device. However, in this case, a radiated wave from a communication device itself remains in a room due to reflection, and this reflected wave and a desired communication radio wave can be interfered, thereby causing deterioration of communication quality. In order to prevent this communication failure including deterioration of communication quality, and radio interference and false communication, a wave absorber is used, in which radio waves are absorbed and converted into heat.

Examples of a wave absorber generally include a material in which electromagnetic wave energy can be converted into heat and consumed. Examples of this material include a material having magnetic loss, dielectric loss, or ohmic loss. Specifically, proposed examples of a wave absorber include a wave absorber produced by mixing and dispersing a magnetic powder such as ferrite or a soft magnetic metal in an insulative matrix such as a rubber or a plastic; and molding it to be sheet-shaped or block-shaped (for example, see Patent Document 1.).

Also, specifically proposed examples of a wave absorber include a wave absorber produced by impregnating a dielectric loss powder such as carbon black in foamed polyurethane; and molding it to be pyramid-shaped or wedge-shaped (for example, see Patent Document 2.).

Also, specifically proposed examples of a wave absorber include a wave absorber produced by placing resistance films with about 377 Ω in a position being λ/4 (λ: a wavelength of a radio wave at a certain frequency) apart from the reflector (for example, see Patent Document 3.). This wave absorber is called a λ/4 type, and 377 Ω is the characteristic impedance in free space.

Also, specifically proposed examples of a wave absorber include a wave absorber produced by forming periodic conductive patterns on the surface of an absorber (for example, see Patent Document 4.). This wave absorber is proposed to be thin-sized and reduced in weight.

Furthermore, specifically proposed examples of a wave absorber include a wave absorber produced by forming periodic conducting loops on the surface of an absorber (for example, see Patent Document 5.). This wave absorber is proposed to be thin-sized, reduced in weight, and improved in a wave absorption property from an oblique direction.

However, in the wave absorber described in Patent Document 1, which is produced by mixing and dispersing a magnetic powder such as ferrite or a soft magnetic metal in an insulative matrix such as a rubber or a plastic followed by molding, it is possible to form a relatively thin absorber, but there are the drawbacks that a more thickness is necessary when high-performance wave absorption is required, and there is a problem in that the weight increases due to use of material of high specific gravity.

Also, in a wave absorber described in Patent Document 2, which is produced by impregnating a dielectric loss powder such as carbon black in foamed polyurethane followed by molding, the absorption performance is basically dependent on thickness. Therefore, there are problems in that the wave absorber should be pyramid-shaped or wedge-shaped or that the thickness should be large along the absorption direction, in order to obtain the desired performance.

Therefore, in order to obtain desired performance, the wave absorber should be pyramid-shaped or wedge-shaped, or the thickness should be large along the absorption direction. These are problems.

Also, in a wave absorber described in Patent Document 3, which is produced by placing resistance films with about 377 Ω in the position being λ/4 apart from the reflector, a transparent wave absorber can be produced by using optically transparent resistance films. However, a wave absorber described in Patent Document 3 requires a thickness of λ/4 at a certain frequency in principle, and has a problem in that a radio wave absorption property varies according to the incident angle of the wave.

In addition, Patent Document 4 discloses a wave absorber including a periodic loop pattern, in which plural conductive patterns are placed regularly, and an intermediate resin layer and a conductive reflection layer. The resin layer contains loss materials. Also, Patent Document 4 discloses that this wave absorber is thin-sized and reduced in weight in comparison with conventional ones. However, this wave absorber has a problem in that a radio wave absorption property (frequency) varies according to the incident angle of the wave as in the case of the λ/4 type.

Furthermore, Patent Document 5 discloses a wave absorber including periodic conducting loops are placed regularly, an intermediate resin layer and a conductive reflection layer, whose thickness is 0.027 times or more of a wavelength to be absorbed. Also, Patent Document 5 discloses that this wave absorber is thin-sized and reduced in weight in comparison with conventional ones. However, in a wave absorber having a structure in which patterns with a single size are periodically arranged, a frequency bandwidth is so restricted as to become quite narrow although variation of wave absorption properties (frequency) according to incident angle is prevented. Therefore, the wave absorber has a problem in property variation during production.

[Patent Document 1] Japanese Unexamined Patent Application, First Publication No. 2001-308584

[Patent Document 2] Japanese Unexamined Patent Application, First Publication No. Hei 10-051180

[Patent Document 3] Japanese Unexamined Patent Application, First Publication No. Hei 05-335832

[Patent Document 4] Japanese Patent No. 3209453

[Patent Document 5] Japanese Unexamined Patent Application, First Publication No. 2001-352191

DISCLOSURE OF INVENTION

The present invention is aimed to solve the aforementioned problems of the prior arts. Objects of the present invention are to provide a wave absorber which has a reflection-attenuating capability to prevent communication failure due to reflection of an electromagnetic wave, can be thin-sized and reduced in weight, and has low property variation according to the incident angle of the wave.

To achieve the aforementioned objects, a wave absorber of the present invention includes a sequentially laminated structure including a conductor layer (11); a first dielectric layer (12, 13); and a patterned layer (14) including a plurality of patterns formed of the conductive material, wherein each of the patterns in the patterned layer (14) is different from other adjacent patterns with respect to at least one of size and shape. The pattern in the patterned layer (14) may be a loop pattern having a loop shape or a patch pattern having a round shape or a square shape.

According to a wave absorber of the present invention, the patterns in the patterned layer (14) function as an antenna, and can receive waves in a wide band because each of the patterns is different with respect to size or shape. During the reception, an electromagnetic wave leaks to the first dielectric layer (12, 13), and the electromagnetic wave is converted into heat and consumed due to the dielectric loss component of the first dielectric layer (12, 13). Therefore, a wave absorber of the present invention has a nonconventional, wide-band reflection-attenuating property while it is thin-sized and reduced in weight.

Also, in a wave absorber of the present invention, it is preferable that the pattern in the patterned layer (14) be a loop pattern having a loop shape, that the loop pattern be formed of the conductive material having a shape in which a line width is within 5% to 25% of a central line length (C1, C2, and C3) which is thee length of the central line of the loop pattern, that the central line length (C1, C2, and C3) of the loop pattern be within 60% to 140% of an effective wavelength (λg, see formula 1) of an electromagnetic wave to be absorbed, and that any one of the loop patterns in the patterned layer (14) be different from other adjacent loop patterns to the loop pattern with respect to the central line length (C1, C2, and C3) and shape.

According to a wave absorber of the present invention, a frequency band of a radio wave received by the loop pattern can be adjusted to that of a radio wave to be absorbed, and the configuration, which forms an assembly of a plurality of the loop pattern and/or the patch pattern whose shape or size is different each other, enables a wide-band reflection-attenuating property to be obtained. Herein, each of the patterns may be closed loop, or an opened loop in which a part of it is disconnected. Also, a shape of each of the patterns can be any shape such as a loop or patch which has a round shape, a square shape, or a polygonal shape. Therefore, a wave absorber of the present invention can effectively prevent communication failure due to reflection of an electromagnetic wave.

$$\lambda g = \lambda \times \sqrt{(2/(\epsilon_r+1))} \quad (\epsilon_r: \text{relative dielectric constant of a substrate}) \quad \text{(Formula 1)}$$

Also, in a wave absorber of the present invention, it is preferable that at least one of the loop patterns and the patch patterns having the round shape or the square shape in the patterned layer (14) have a shape in which a projection is provided on a part of the pattern.

According to a wave absorber of the present invention, a frequency and a frequency band at which a reflection-attenuating property is high can be easily adjusted by adjusting a size, a shape, or a position of the projection (for example, a line-shaped pattern). Therefore, it is possible to easily provide a high-performance wave absorber which can effectively absorb an electromagnetic wave to be absorbed.

Also, in a wave absorber of the present invention, it is preferable that an assembly of a plurality of the loop pattern and/or the patch pattern, whose shape or size is different to each other, constitute a unit, and that the units be allocated such that a spacing between the units is predetermined.

According to a wave absorber of the present invention, it is possible to easily realize a large-area wave absorber which is reduced in weight and thin-sized and which can obtain a wide-band reflection-attenuating property.

Also, it is preferable that a wave absorber of the present invention further include a second dielectric layer (31, 36) which is laminated on the surface of at least one of the conductor layer (32) and the patterned layer (35).

According to a wave absorber of the present invention, the second dielectric layer (31, 36) can prevent the conductivity change (for example oxidation) of a conductive material (for example a metal) in the conductor layer (32) and the patterned layer (35), and can impart functions such as a hard coat or a UV cutoff to layers. Therefore, a long-life wave absorber can be provided.

Also, in a wave absorber of the present invention, it is preferable that a surface resistivity of the conductive material forming the pattern be within 1 [Ω/□] to 30 [Ω/□].

According to a wave absorber of the present invention, an electromagnetic wave is converted into heat and consumed by a dielectric loss component of a dielectric layer (22, 23). At the same time, an electromagnetic wave is converted into heat and consumed by a resistance loss of a pattern itself. Therefore, it is possible to improve a function to convert an electromagnetic wave into heat followed by consuming and to improve a reflection-attenuating capability with reducing in weight and thin-sizing.

Also, in a wave absorber of the present invention, it is preferable that the conductor layer be a low-resistance conductor layer with a surface resistivity of 30 [Ω/□] or less. Examples of a material of the low-resistance conductor layer include a conductive oxide such as ITO (Indium Tin Oxide) and a conductive paste containing metallic fine particles.

Also, in a wave absorber of the present invention, it is preferable that the conductor layer (21, 32) be a grating-shaped conductor layer having a grating-shaped pattern. Herein, the grating-shaped conductor layer preferably has a line width of 100 μm or less and a central line spacing of one sixteenth or less of a wavelength of an electromagnetic wave to be absorbed.

Also, in a wave absorber of the present invention, it is preferable that the conductive material used in the conductor layer (42) and the pattered layer (45) be an optically transparent material such as a conductive oxide or a conductive organic compound), and that the first and second dielectric layers be formed of an optically transparent dielectric material.

Herein, a transparent conductive oxide such as ITO (Indium Tin Oxide) may be used for the conductor layer (42), and an opaque conductive material (such as a metal) can be used for the grating-shaped conductor layer having a line width of 100 μm or less and a central line spacing of one sixteenth of an effective wavelength (λg) of an electromagnetic wave to be absorbed.

According to the present invention, it is possible to provide transparent wave absorber with a thin thickness in comparison with a conventional λ/4 type transparent wave absorber.

According to the present invention, it is possible to provide a wave absorber which has a reflection-attenuating capability to prevent communication failure due to reflection of an electromagnetic wave, can be more thin-sized and reduced in weight than a conventional wave absorber, and has a broadband attenuation property in which property variation is small according to the incident angle of a radio wave.

Figure 1:
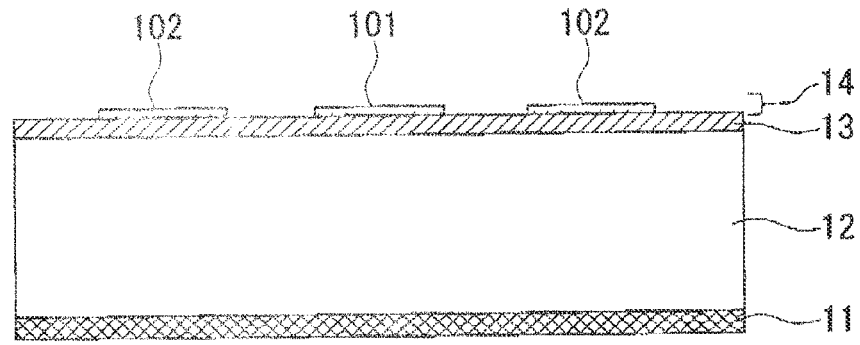
FIG. 1 is a cross-sectional view of a wave absorber of a first embodiment of the present invention.

The reference numerals shown in these figures are defined as follows:

11 represents a conductor layer;
12 represents a PC (polycarbonate) substrate (a first dielectric layer A);
13 represents a BT (bismaleimide-triazine) substrate (a first dielectric layer B);
14 represents a patterned layer;
21 represents a grating-shaped conductor layer;
22 represents a PC substrate (a first dielectric layer A);
23 represents a PET (polyethylene terephthalate) substrate (a first dielectric layer B);
24 represents a patterned layer;
25 represents a PC substrate (a second dielectric layer);
31 represents a PET substrate (a second dielectric layer A);
32 represents a grating-shaped conductor layer;
33 represents a PC substrate (a first dielectric layer A);
34 represents a PET substrate (a first dielectric layer B);
35 represents a patterned layer;
36 represents a PC substrate (a second dielectric layer B);
41 represents a PET substrate (a second dielectric layer A);
42 represents a transparent conductor layer;
43 represents a PC substrate (a first dielectric layer A);
44 represents a PET substrate (a first dielectric layer B);
45 represents a patterned layer;
46 represents a PC substrate (a second dielectric layer B);
51 represents an conductor layer;
52 and 54 represent an EPT (ethylene-propylene rubber) layer (first and second dielectric layers);
53 represents a ferrite dispersion resin layer (a ferrite magnetic loss layers);
55 represents a patterned layer;
61 represents a low resistance ITO layer;
62 represents a PC substrate (a dielectric layer);
63 represents a high resistance ITO layer;
71 represents a conductor layer;
72 represents a PC substrate (a first dielectric layer A);
73 represents a BT substrate (a first dielectric layer B);
74 represents a patterned layer;
101, 102, 103, 201, 202, and 203 represent a loop pattern;
301, 302, 303, 401, 402, and 403 represent a loop pattern;
501 represents a round-shaped patch pattern;
701 represents a square-shaped loop pattern, and
103a, 203a, 303a, and 403a represents an open stub.

BEST MODE FOR CARRYING OUT THE INVENTION

Hereinafter, the best mode for carrying out the present invention will be described referring to the drawings.

A wave absorber of the present embodiment preferably prevents communication failure in an ETC (Electronic Toll Collection) system, for example. In an ETC system, an antenna installed at a tollgate in a toll road and a terminal loaded into an automobile communicate with each other using a radio wave having a frequency band of 5.8 GHz, and a tollage of a toll road is paid without pulling up.

A wave absorber of the present embodiment preferably absorbs an unnecessary radio wave in an ETC system and prevents a malfunction of this system. For example, it is preferable to install a wave absorber of the present embodiment on a roof (an undersurface of a roof) or on a surface of a side wall of a tollgate equipped with an ETC system. In addition, it is preferable to install a transparent wave absorber described in the present embodiment between ETC lanes of a tollgate equipped with an ETC system.

First Embodiment

FIG. 1 is a cross-sectional view showing schematic features of a wave absorber of the first embodiment of the present invention. A wave absorber of the present embodiment includes a sequentially laminated structure including a conductor layer (11) formed of a copper foil having a thickness of 18 μm; a PC (polycarbonate) substrate (12) having a thickness of 2.0 mm, which forms a first dielectric layer A; a BT (bismaleimide-trazine) substrate (13) having a thickness of 0.3 mm, which forms a first dielectric layer B; and a patterned layer (14) in which a plurality of loop patterns, which is formed of a copper foil and is different with respect to a shape thereof, is placed periodically.

Figure 2:
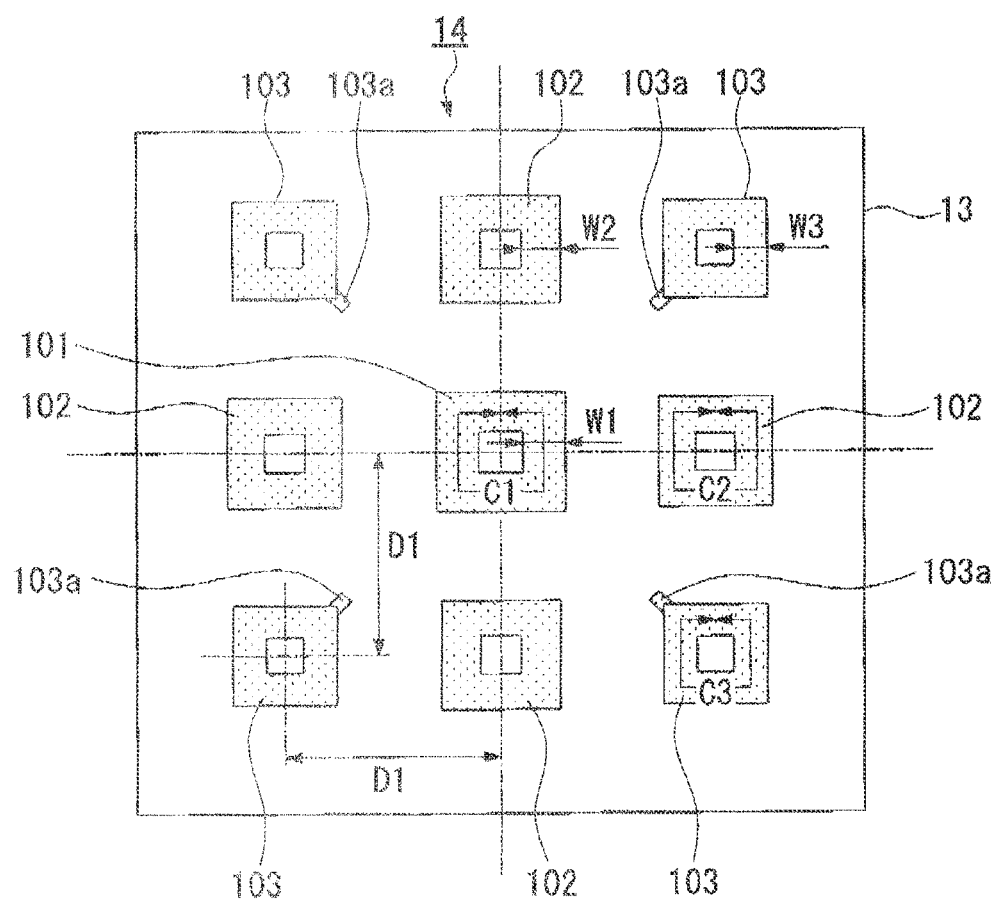
FIG. 2 is a plan view showing details of a patterned layer in the wave absorber illustrated in FIG. 1.

FIG. 2 is a plan view of the wave absorber illustrated in FIG. 1, and shows detailed features of a patterned layer (14). The patterned layer (14) includes a plurality of loop patterns (101, 102, and 103) formed on the upper surface of the BT substrate (13). Each of loop patterns (101, 102, and 103) is formed of a copper foil, and is placed on the upper surface of the BT substrate (13) periodically (i.e. regularly with a certain spacing between each other). The shapes of the loop patterns (101, 102, and 103) are different to each other as illustrated in FIG. 2, and are a square loop having central loop lengths (C1, C2, and C3) and line widths (W1, W2, and W3). Herein, the central loop length means the length of the longitudinal central axis of the line in the loop patterns (101, 102, and 103) (hereinafter, the same applies.). The center points of the adjacent loop patterns (101, 102, and 103) are placed with a distance (D1) between centers.

As illustrated in FIG. 2, a projection-shaped, line-shaped pattern (open stub) (103a) is added to the loop-shaped line in the loop pattern (103). The open stub (103a) is added to one of vertices of a square loop, and is a rectangle having a line width of 2.0 mm and a length of 2.4 mm. The longitudinal direction of the rectangle and a side of the square loop form an angle of 45°.

The patterned layer (14) including these loop patterns (101, 102, and 103) can be formed by patterning the BT substrate (13), in which a copper foil is formed on the surface, by patterning using a photoresist mask and an etching solution containing ferric chloride and hydrochloric acid. The dimension of each part of the loop patterns (101, 102, and 103) is described in Table 1.

The line widths (W1, W2, and W3) of the loop patterns (101, 102, and 103) are preferably within 5% to 25%, and more preferably within 10% to 20% of the central line lengths (C1, C2, and C3), respectively. Also, the line widths (W1, W2, and W3) of the loop patterns (101, 102, and 103) are preferably within 60% to 140%, and more preferably within 80% to 120% of an effective wavelength ($\lambda g$) of an electromagnetic wave to be absorbed in the patterned surface of a substrate.

Hereinafter, the measuring method of the wave absorption property of a wave absorber of the present embodiment, which includes the aforementioned structure, will be described.

First, pyramid cone-shaped wave absorbers, in which a reflection amount to a radio wave with a predetermined frequency to be measured (to be absorbed) is −40 [dB] or less, are placed on the wall surfaces, the flooring, and the side of the measurement surface in a measurement room. Then, a horn antenna for transmission is placed such that an incident angle of a radio wave to a measurement sample (a wave absorber) becomes a predetermined angle (for example 20° from the front side), and a horn antenna for reception is placed in the direction (a direction of optical reflection) which an electromagnetic wave, which is transmitted by a horn antenna for transmission and then reflected by the measurement sample, heads in. Herein, a right-handed circularly polarized wave horn antenna is used as a horn antenna for transmission, and a left-handed circularly polarized wave horn antenna is used as a horn antenna for reception.

In the aforementioned configuration, radio wave transmitted by a horn antenna for transmission is totally reflected by a metal plate, and received by a horn antenna for reception.

Subsequently, the horn antennae for transmission a reception are connected to a vector network analyzer (Agilent8722ES), and a free space time domain method is used to separate only a radio wave which is reflected by a measurement sample (a wave absorber), thereby measuring S parameter (S21).

First, a metal reflection plate (a Cu plate) is placed at the position being 140 cm apart from each of the antennae, and a radio wave having a predetermined frequency and a predetermined intensity is transmitted by the horn antenna for transmission. Then, a reception level of the antenna for reception is measured. Next, in place of the metal reflection plate (a Cu plate), a measurement sample (a wave absorber) having the same size is placed at the same position as the metal reflection plate (a Cu plate). Then, the same radio wave as for the metal reflection plate (a Cu plate) is transmitted by the horn antenna for transmission, and the reception level of the antenna for reception is measured.

Figure 3:
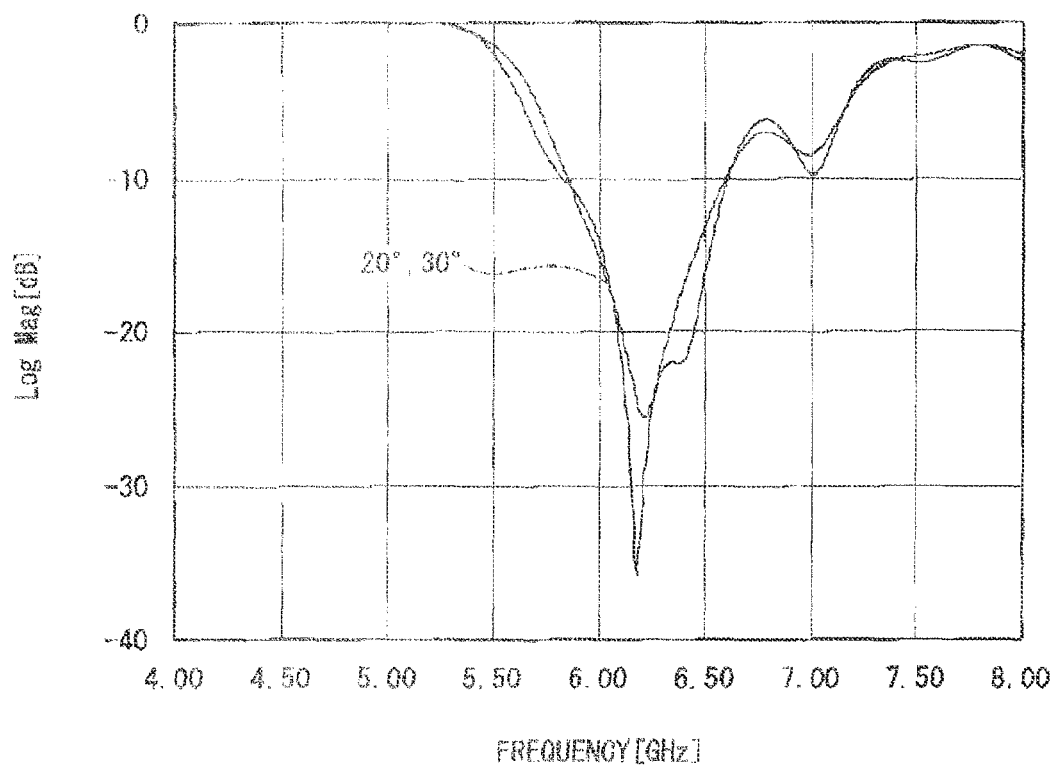
FIG. 3 is a graph sowing a radio wave-absorbing property of the wave absorber illustrated in FIG. 1.

In this way, a difference (electric power ratio) between the reception level measured for a metal reflection plate (a Cu plane) and the reception level measured for a wave absorber is evaluated as a reflection-attenuating amount. FIG. 3 shows the measurement and evaluation results at incident angles of 20° and 30°. When an effective absorption bandwidth is defined as a frequency bandwidth having an attenuation property of 20 [dB] or more in spite of incident angle change, it is found from FIG. 3 that a wave absorber of the present embodiment has an effective absorption bandwidth of about 240 [MHz] and shows a wide-band attenuation property because property variation according to the incident angle of a radio wave is low.

Second Embodiment

Figure 4:
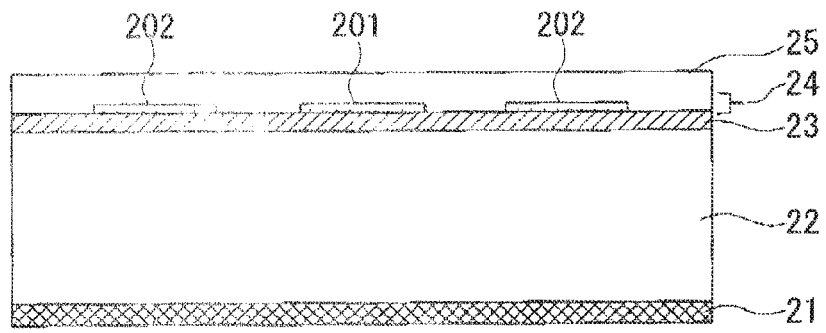
FIG. 4 is a cross-sectional view of a wave absorber of a second embodiment of the present invention.

FIG. 4 is a cross-sectional view showing schematic features of a wave absorber of the second embodiment of the present invention. A wave absorber of the present embodiment includes a sequentially laminated structure including a grating-shaped conductor layer (21) formed by using a conductive mesh cross; a PC (polycarbonate) substrate (22) having a thickness of 3.7 mm, which forms a first dielectric layer A; a PET (polyethylene terephthalate) substrate (23) having a thickness of 0.1 mm, which forms a first dielectric layer B; a patterned layer (24) in which a plurality of loop patterns, which is formed of ITO (Indium Tin Oxide) having a surface resistivity (sheet resistance) of 10 [Ω/□] and is different with respect of a shape thereof, is placed periodically; and a PC substrate (25) having a thickness of 0.3 mm.

Herein, a grating-shaped conductor layer (21) is formed with a line width of about 30 μm and a central line spacing of 0.254 mm, and has a function to totally reflect a radio wave. A line width of the grating-shaped conductor layer (21) is preferably 100 μm or less, more preferably 1 μm or more and 100 μm or less, and particularly preferably 1 μm or more and 50 μm or less. There is no restriction on a central line spacing of the grating-shaped conductor layer (21) as long as it has a sufficient spacing to totally reflect a radio wave. The central line spacing is preferably one sixteenth or less, more preferably one thousandth or more and one sixteenth or less, and particularly preferably one thousandth or more and one thirty second or less of a wavelength of an electromagnetic wave to be absorbed. Also, a conductor layer can be used in place of a grating-shaped conductor layer (21).

Also, a patterned layer (24) is formed of ITO (Indium Tin Oxide). A surface resistivity (sheet resistance) is preferably within the range of 1 [Ω/□] to 30 [Ω/□], and more preferably the range of 5 [Ω/□] to 25 [Ω/□]. However, an optimum pattern varies according to the surface resistivity thereof.

Figure 5:
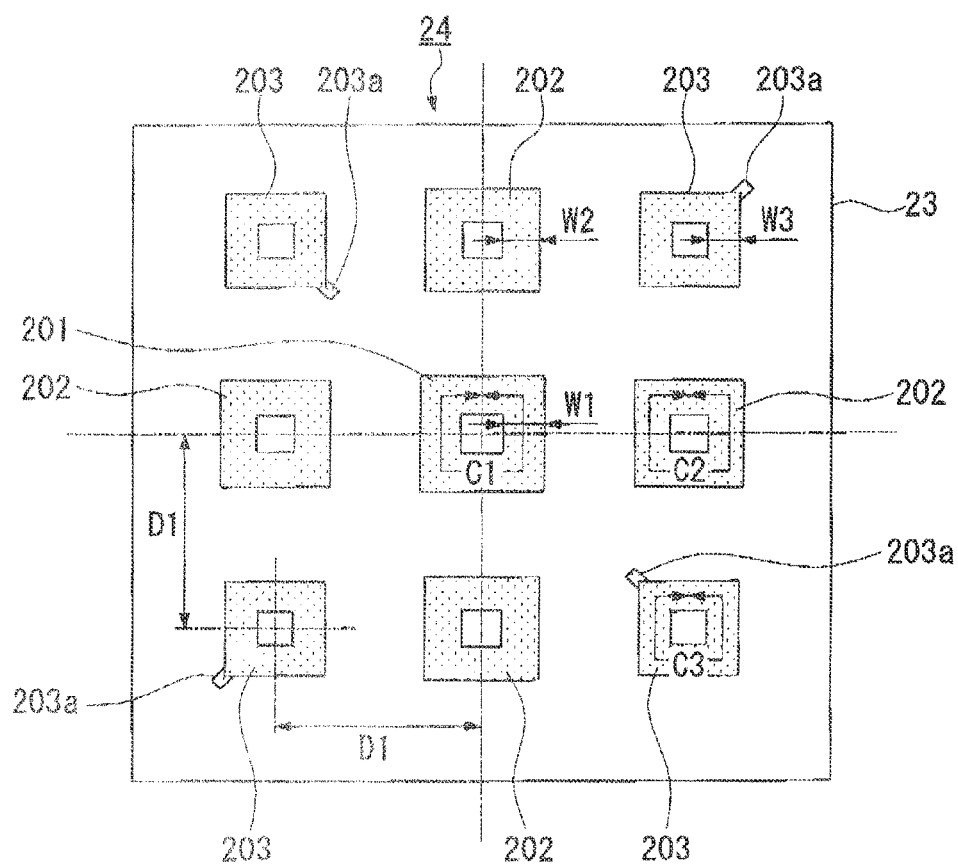
FIG. 5 is a plan view showing details of a patterned layer in the wave absorber illustrated in FIG. 4.

FIG. 5 is a plan view of the wave absorber illustrated in FIG. 4, and shows detailed features of a patterned layer (24). The patterned layer (24) includes a plurality of loop patterns (201, 202, and 203) formed on the upper surface of the PET substrate (23). Each of the loop patterns (201, 202, and 203) is formed of ITO, and is placed on the upper surface of the PET substrate (23) periodically (i.e. regularly with a certain spacing between each other). The shapes of the loop patterns (201, 202, and 203) are different to each other as illustrated in FIG. 5, and are a square loop having central loop lengths (C1, C2, and C3) and line widths (W1, W2, and W3). The center points of the adjacent loop patterns (201, 202, and 203) are placed with the distance (D1) between centers.

As illustrated in FIG. 5, a projection-shaped, line-shaped pattern (open stub) (203a) is added to the loop-shaped line in the loop pattern (203). The open stub (203a) is added to one of vertices of a square loop, and is a rectangle having a line width of 2.0 mm and a length of 2.4 mm. The longitudinal direction of the rectangle and a side of the square loop form an angle of 45°.

The patterned layer (24) including these loop patterns (201, 202, and 203) can be formed by patterning the PET substrate (23), in which an ITO film is formed on the surface, by patterning using a photoresist mask and an etching solution containing ferric chloride and hydrochloric acid. The dimension of each part of the loop patterns (201, 202, and 203) is described in Table 1.

Figure 6:
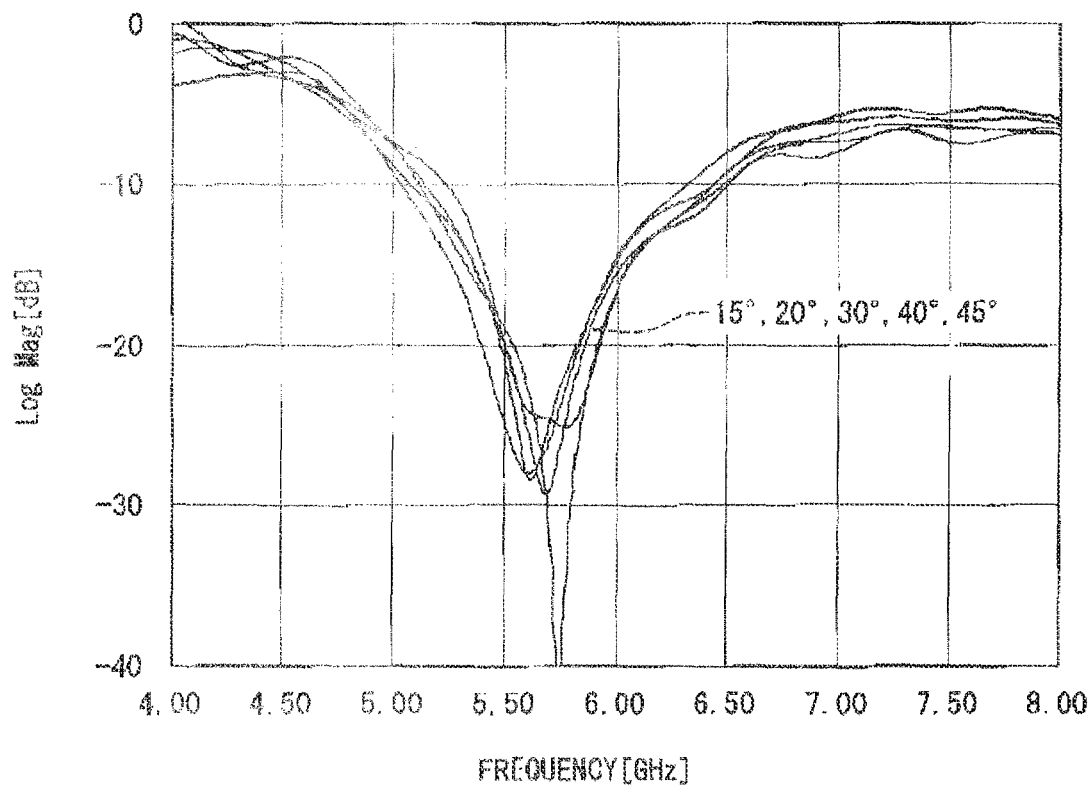
FIG. 6 is a graph showing a radio wave-absorbing property of the wave absorber illustrated in FIG. 4.

The same measuring method of the wave absorption property as in the first embodiment is used for a wave absorber of the present embodiment. FIG. 6 shows the measurement and evaluation results of the reflection-attenuating amount within the incident angle range of 15° to 45°. When an effective absorption bandwidth is defined as a frequency bandwidth having an attenuation property of 20 [dB] or more in spite of an incident angle change, it is found from FIG. 6 that a wave absorber of the present embodiment has an effective absorption bandwidth of about 300 [MHz] and shows a wide-band attenuation property because property variation according to the incident angle of a radio wave is low. Also, it is found from the comparison between the second embodiment and the first embodiment that an optimum value of the thickness of a dielectric layer varies according to the differences of a surface resistivity and a pattern size of a patterned layer, and a conductor layer (see Table 1).

Third Embodiment

Figure 7:
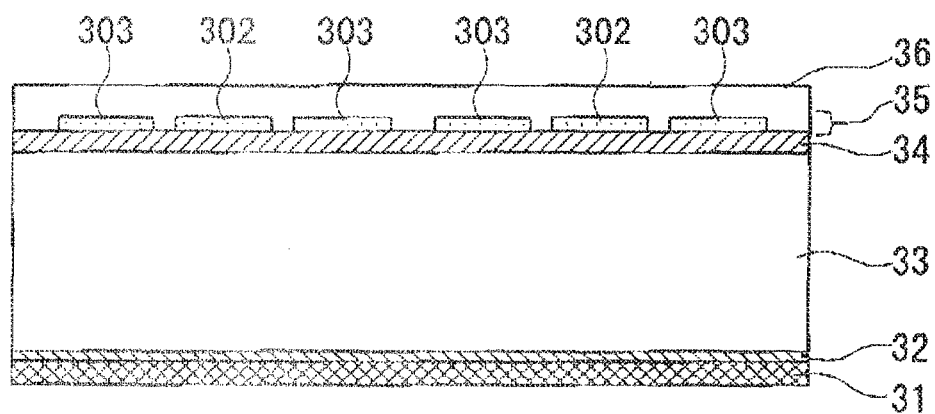
FIG. 7 is a cross-sectional view of a wave absorber of a third embodiment of the present invention.

FIG. 7 is a cross-sectional view showing schematic features of a wave absorber of the third embodiment of the present invention. A wave absorber of the present embodiment includes a sequentially laminated structure including a grating-shaped conductor layer (32) formed by screen printing using a conductive silver plate on a PET substrate (31) as a second dielectric layer A; a PC substrate (33) having a thickness of 3.2 mm, which forms a first dielectric layer A; a PET substrate (34) having a thickness of 0.1 mm, which forms a first dielectric layer B; a patterned layer (35) in which a plurality of loop patterns, which is formed of ITO having a surface resistivity (sheet resistance) of 10 [Ω/□] and is different with respect to a shape thereof, is placed periodically; and a PC substrate (36) having a thickness of 0.3 mm.

Herein, a grating-shaped conductor layer (32) is formed with a line width of about 100 μm and a central line spacing of 1.4 mm, and has a function to totally reflect a radio wave. Also, the loop patterns in the patterned layer (35) have a large-area structure in which an assembly of a plurality of the loop patterns whose shape is different constitutes a unit, and the units are placed with a predetermined spacing (D2) between the units.

Figure 8:
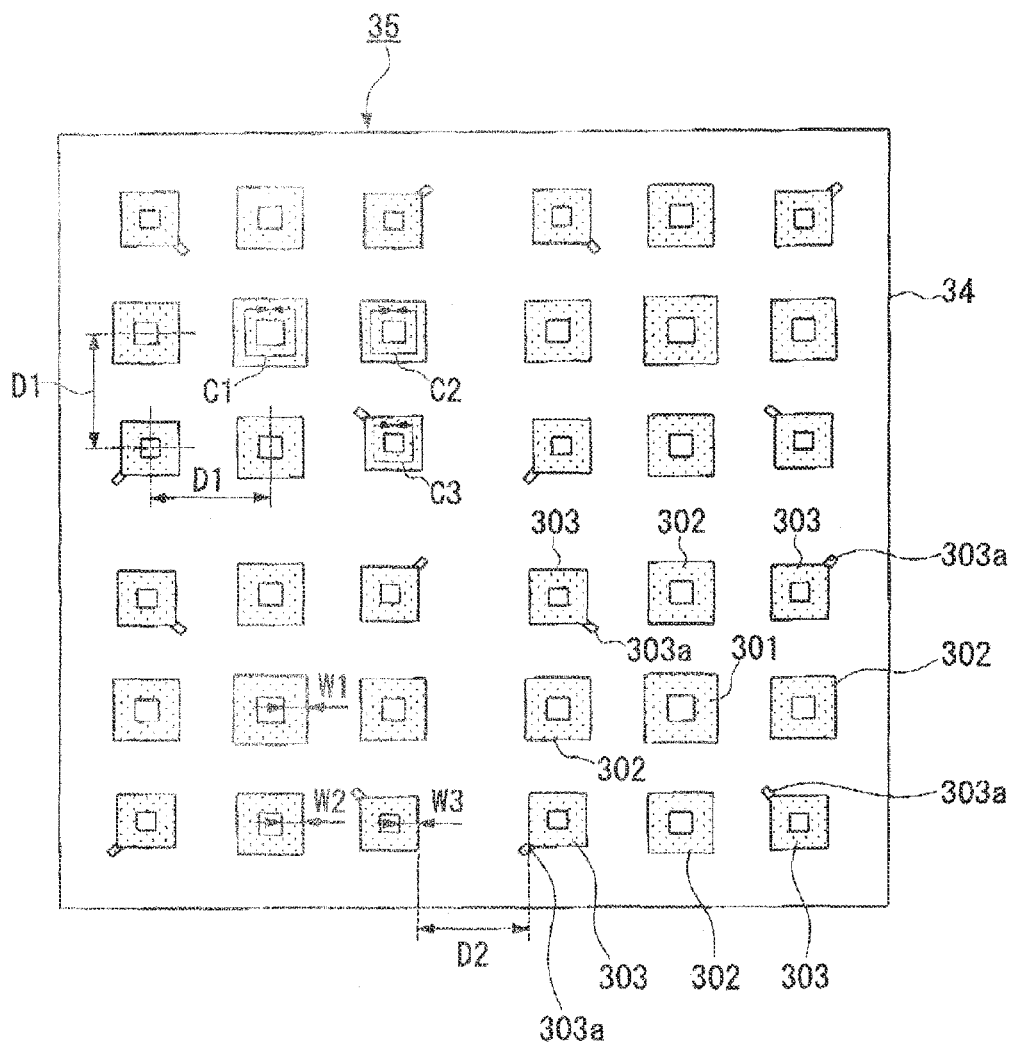
FIG. 8 is a plan view showing details of a patterned layer in the wave absorber illustrated in FIG. 7.

FIG. 8 is a plan view of the wave absorber illustrated in FIG. 7, and shows detailed features of a patterned layer (35). The patterned layer (35) includes a plurality of loop patterns (301, 302, and 303) formed on the upper surface of the PET substrate (34). Each of the loop patterns (301, 302, and 303) is formed of ITO, and is placed on the upper surface of the PET substrate (34) periodically (i.e. regularly with a certain spacing between each other).

The shapes of the loop patterns (301, 302, and 303) are different to each other as illustrated in FIG. 8, and are a square loop having central loop lengths (C1, C2 and C3) and line widths (W1, W2, and W3). The center points of the adjacent loop patterns (301, 302, and 303) are placed with the distance (D1) between centers.

As illustrated in FIG. 8 a projection-shaped, line-shaped pattern (open stub) (303a) is added to the loop-shaped line in the loop pattern (303). The open stub (303a) is added to one of vertices of a square loop, and is a rectangle having a line width of 2.0 mm and a length of 2.4 mm. The longitudinal direction of the rectangle and a side of the square loop form an angle of 45°. The dimension of each part of the loop patterns (301, 302, and 303) is described in Table 1.

Figure 9:
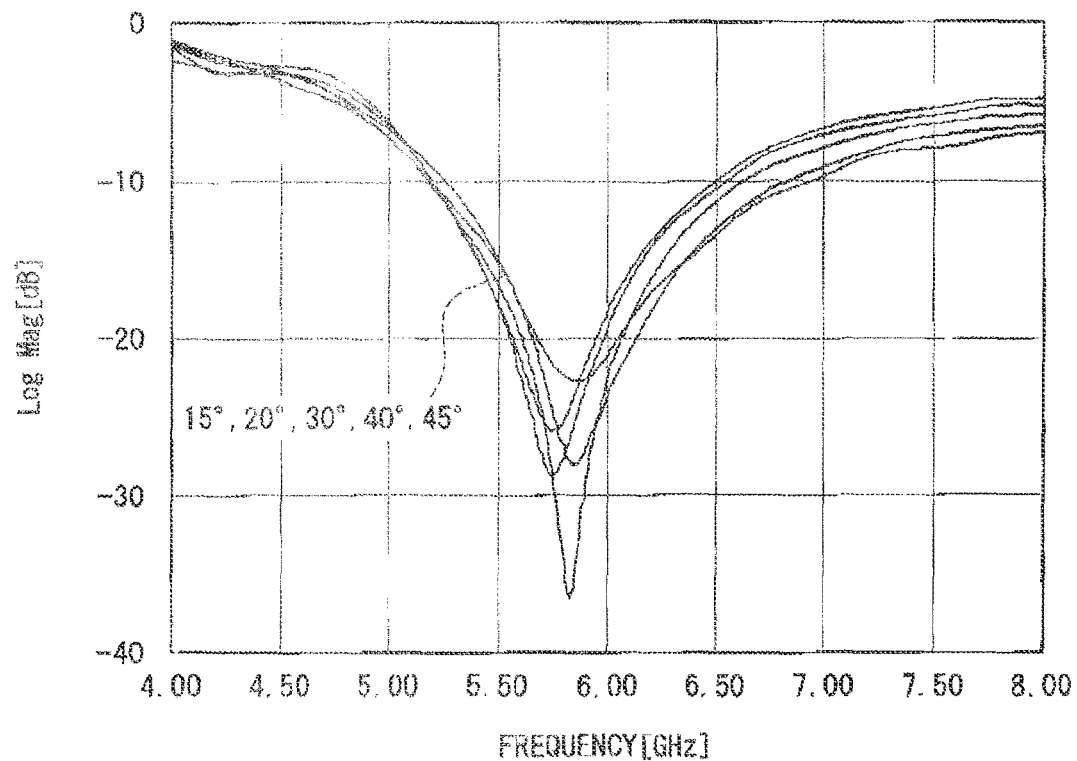
FIG. 9 is a graph showing a radio wave-absorbing property of the wave absorber illustrated in FIG. 7.

The same production method of a wave absorber and the same measuring method of the wave absorption property thereof as in the second embodiment are used for a wave absorber of the present embodiment. FIG. 9 shows the measurement and evaluation results of the reflection-attenuating amount within the incident angle range of 15° to 45°. When an effective absorption bandwith is defined as a frequency bandwidth having an attenuation property of 20 [dB] or more in spite of an incident angle change, is found from FIG. 9 that a wave absorber of the present embodiment has an effective absorption bandwidth of about 300 [MHz] and shows a wide-band attenuation property because property variation according to the incident angle of a radio wave is low. Also, it is found from the comparison between the third embodiment and the second embodiment that an optimum value of the thickness of a dielectric layer varies according to the differences of a surface resistivity and a pattern size of a patterned layer, and a conductor layer (see Table 1). Also, it is found that enlargement of the area is possible by using a wave absorber of the present embodiment.

Fourth Embodiment

Figure 10:
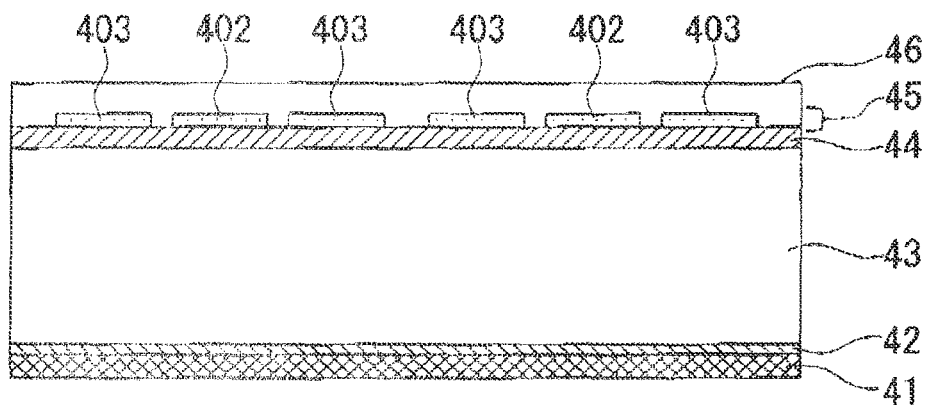
FIG. 10 is a cross-sectional view of a wave absorber of a fourth embodiment of the present invention.

FIG. 10 is a cross-sectional view showing schematic features of a wave absorber of the fourth embodiment of the present invention. A wave absorber of the present embodiment includes a sequentially laminated structure including a transparent conductor layer (42) formed of ITO having a surface resistivity (sheet resistance) of 10 [Ω/□] on a PET substrate (41) as a second dielectric layer A; a PC substrate (43) having a thickness of 3.7 mm, which forms a first dielectric layer A; a PET substrate (44) having a thickness of 0.1 mm, which forms a first dielectric layer B; a patterned layer (45) in which a plurality of loop patterns, which is formed of ITO having a sheet resistance of 10 [Ω/□] and is different with respect to a shape thereof, is placed periodically; and a PC substrate (46) having a thickness of 0.3 mm. Herein, a transparent conductor layer (42) has a function to totally reflect a radio wave.

Figure 11:
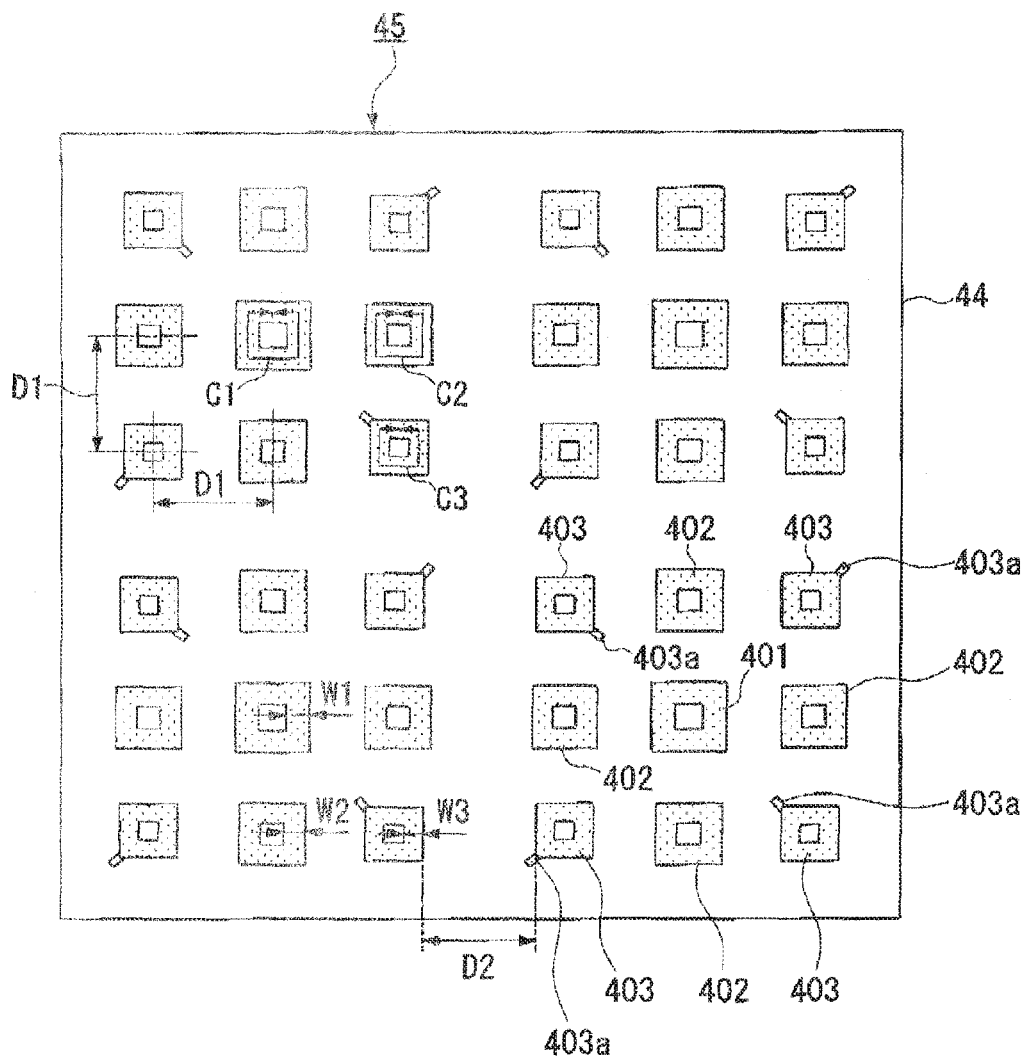
FIG. 11 is a plan view showing details of a patterned layer in the wave absorber illustrated in FIG. 10.

FIG. 11 is a plan view of the wave absorber illustrated in FIG. 10, and showing detailed features of a patterned layer (45). The patterned layer (45) includes a plurality of loop patterns (401, 402, and 403) on the upper surface of the PET substrate (44), which is formed of ITO and is placed periodically (i.e. regularly with a certain spacing between each other). In addition, an open stub (403a) is added to the loop-shaped line in the loop pattern (403).

Herein, loop patterns in the patterned layer (45) are the same as loop patterns in the patterned layer (35) in the third embodiment. The dimension of each part of the loop patterns (401, 402, and 403) is described in Table 1.

Figure 12:
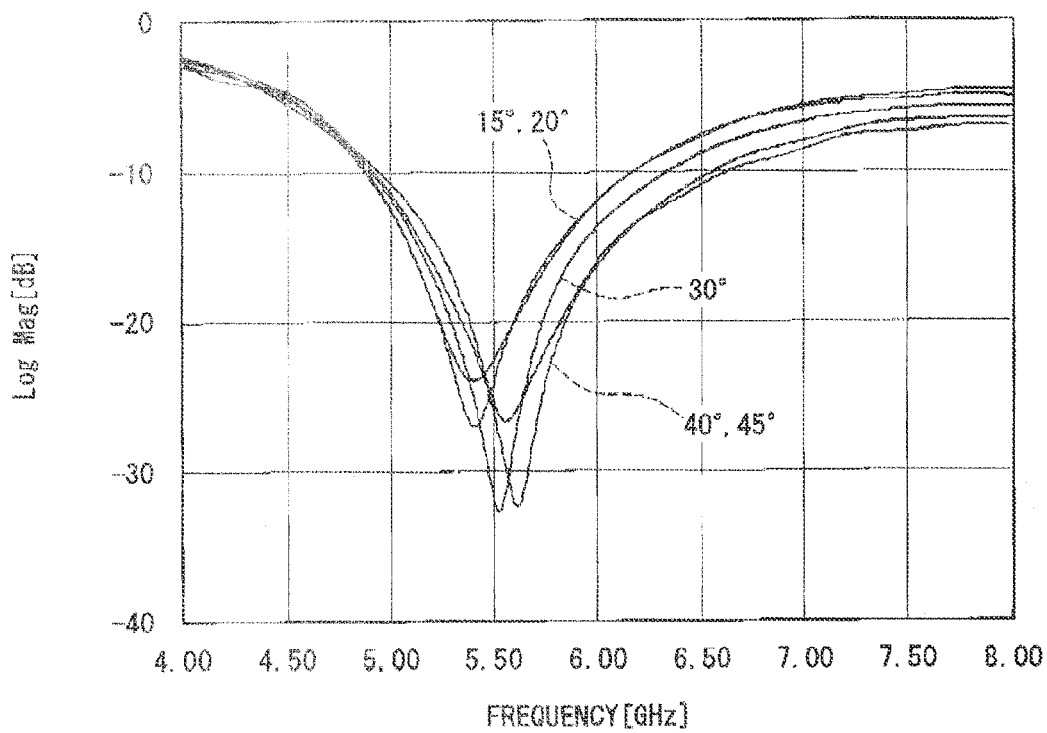
FIG. 12 is a graph showing a radio wave-absorbing property of the wave absorber illustrated in FIG. 11.

The same production method of a wave absorber and the same measuring method of the wave absorption property thereof as in the second embodiment are used for a wave absorber of the present embodiment. FIG. 12 shows the results obtained by measuring the reflection-attenuating amount within the incident angle range of 15° to 45°. When an effective absorption bandwidth is defined as a frequency bandwidth having an attenuation property of 20 [dB] or more in spite of an incident angle change, it is found from FIG. 12 that a wave absorber of the present embodiment has an effective absorption bandwidth of about 300 [MHz] and shows a wide-band attenuation property because property variation according to the incident angle of a radio wave is low. Also, it is found from the comparison between the fourth embodiment and the third embodiment that an optimum value of the thickness and properties of a dielectric layer vary according to the differences of a conductor layer which functions as a reflector.

COMPARATIVE EXAMPLE 1

Hereinafter, differences between a conventional wave absorber (Comparative Example 1) and wave absorbers of the first to fourth embodiments of the present invention will be described referring to FIG. 13 to FIG. 15.

Figure 13:
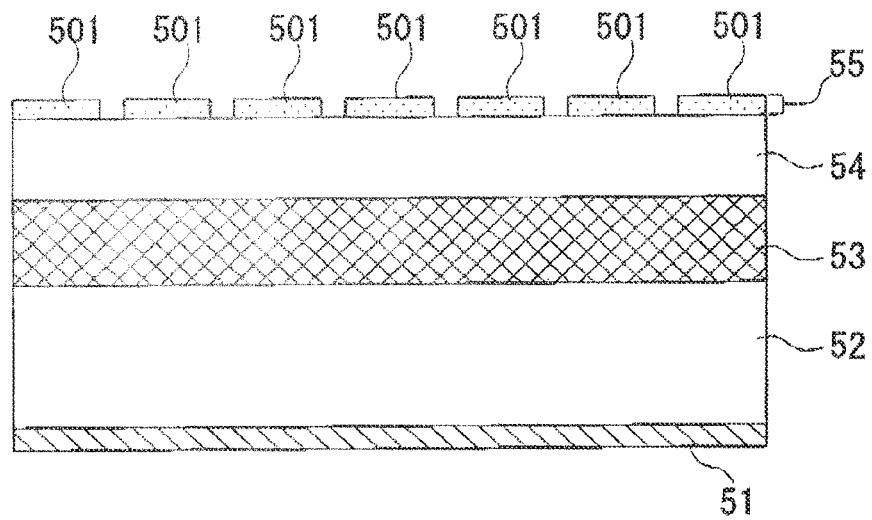
FIG. 13 is a cross-sectional view of a conventional wave absorber (Comparative example 1).

FIG. 13 is a cross-sectional view showing schematic features of a conventional wave absorber (Comparative Example 1). The conventional wave absorber includes a sequentially laminated structure including a conductor layer (51) formed of a copper foil having a thickness of 18 μm; an EPT (ethylene-propylene rubber) layer (52) having a thickness of 0.9 mm, which forms a first dielectric layer; a ferrite dispersion resin layer (53) having a thickness of 0.9 mm, which forms a loss layer; an EPT layer (54) having a thickness of 1.8 mm, which forms a second dielectric layer; and a patterned layer (55) including a plurality of round-shaped patch patterns (501) which is formed of a copper foil having a thickness of 18 μm and is placed periodically.

In other words, a conventional wave absorber uses a laminated body of resin substrates, in which EPT and a magnetic loss material having a large specific gravity are dispersed, as the first dielectric layer in a wave absorber of the first embodiment. Furthermore, a conventional wave absorber uses round-shaped patch patterns (501) having a same shape and a same size as each of loop patterns (101, 102, and 103) in a patterned layer (14).

Figure 14:
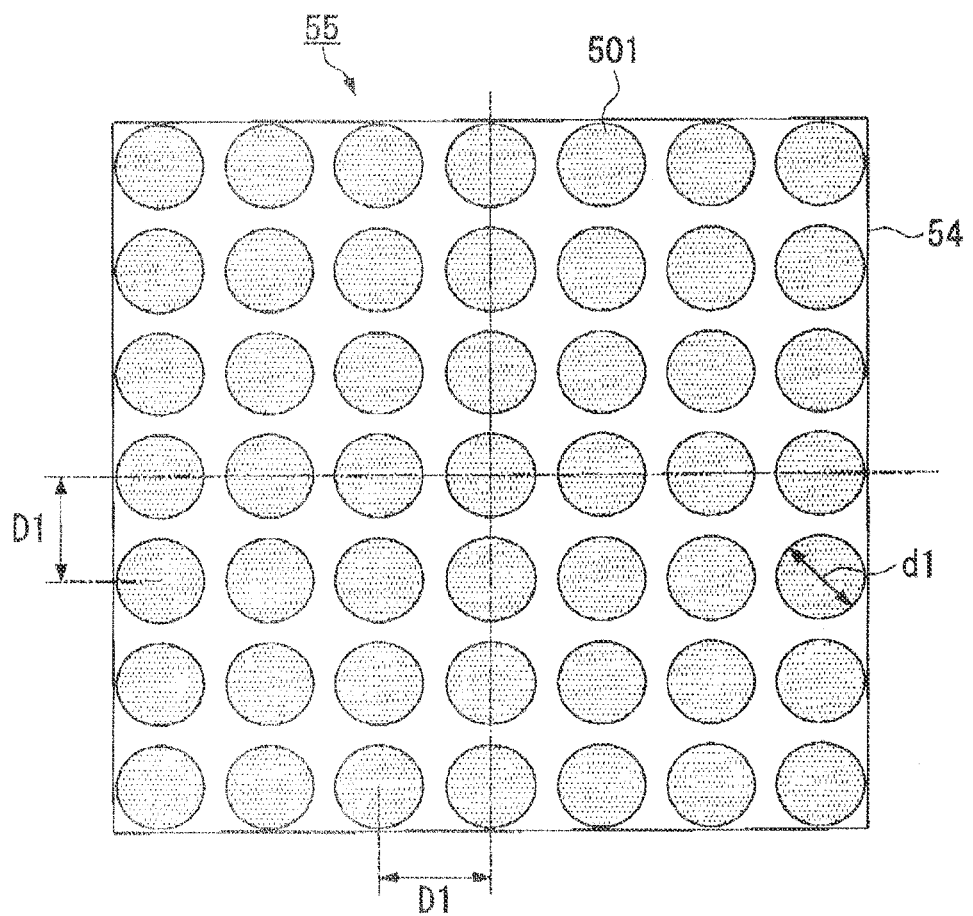
FIG. 14 is a plan view showing details of a patterned layer in the wave absorber illustrated in FIG. 13.

FIG. 14 is a plan view of the conventional wave absorber illustrated in FIG. 13, and shows detailed features of a patterned layer (55). The patterned layer (55) includes a plurality of round-shaped patch patterns (501) formed on the upper surface of an EPT layer (54) forming a second dielectric layer. Each of the round-shaped patch patterns (501) has a same shape and a same size. Specifically, each of the round-shaped patch patterns (501) is formed of a copper foil having a thickness of 18 μm and has a diameter (d1). The round-shaped patch patterns having the same size are placed with the distance (D1) between centers. The dimension of each part is described in Table 1. Herein, the same production method of a wave absorber and the same measuring method of the wave absorption property thereof as in the first embodiment ore used for the conventional wave absorber. FIG. 15 shows the results obtained by measuring the reflection-attenuating amount in this way.

Figure 15:
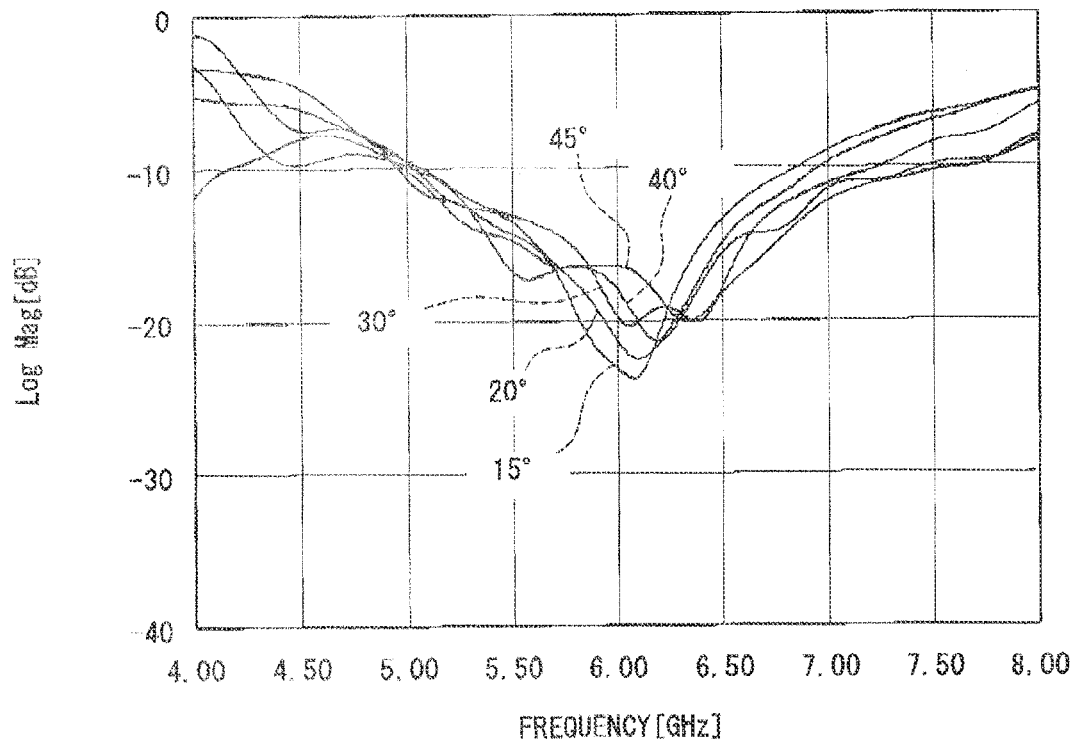
FIG. 15 is a graph showing a radio wave-absorbing property of the wave absorber illustrated in FIG. 13.

As shown in FIG. 15, it is found that an effective absorption bandwidth is narrow in the conventional wave absorber because property variation according to the incident angle of a radio wave is large. In other words, wave absorbers of the first to fourth embodiments of the present invention can be more thin-sized and reduced in weight than a conventional wave absorber and have small property variation according to the incident angle. Therefore, a wave absorber of the present invention can have a sufficient property as a wave absorber used in an ETC system and so on.

COMPARATIVE EXAMPLE 2

Hereinafter, differences between a conventional λ/4 type wave absorber (Comparative Example 2) and wave absorbers of the first to fourth embodiments of the present invention will be described referring to FIG. 16 and FIG. 17.

Figure 16:
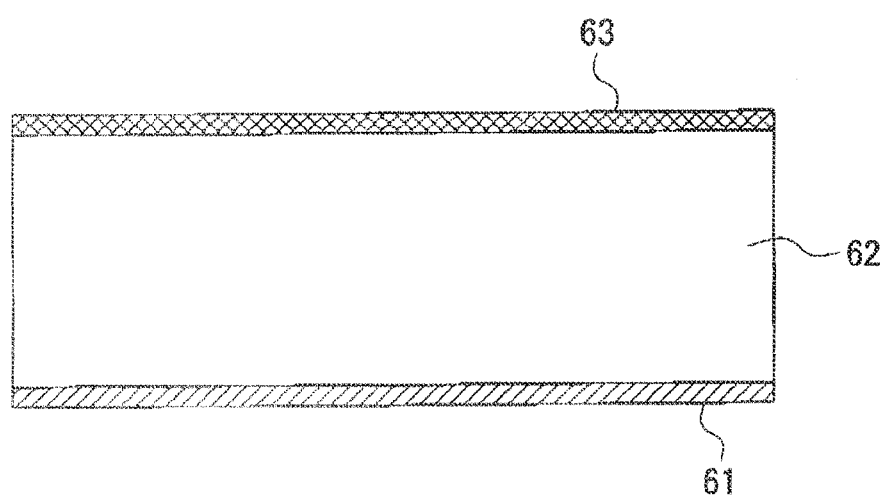
FIG. 16 is a cross-sectional view of a conventional λ/4 type wave absorber (Comparative example 2).

FIG. 16 is a cross-sectional view showing schematic features of a conventional λ/4 type wave absorber (Comparative Example 2). The conventional wave absorber includes a sequentially laminated structure including a low resistance ITO layer (61) having a surface resistivity (sheet resistance) of 10 [Ω/□]; a polycarbonate substrate (62) having a thickness of 8.1 mm as a dielectric layer, and a high resistance ITO layer (63) having a surface resistivity (sheet resistance) of 370 [Ω/□].

That is, this conventional wave absorber does not include a conductive patterned layer.

Herein, the same measuring method of the wave absorption property as in the first embodiment is used for the conventional wave absorber. FIG. 17 shows the results obtained by measuring the reflection-attenuating amount in this way.

Figure 17:
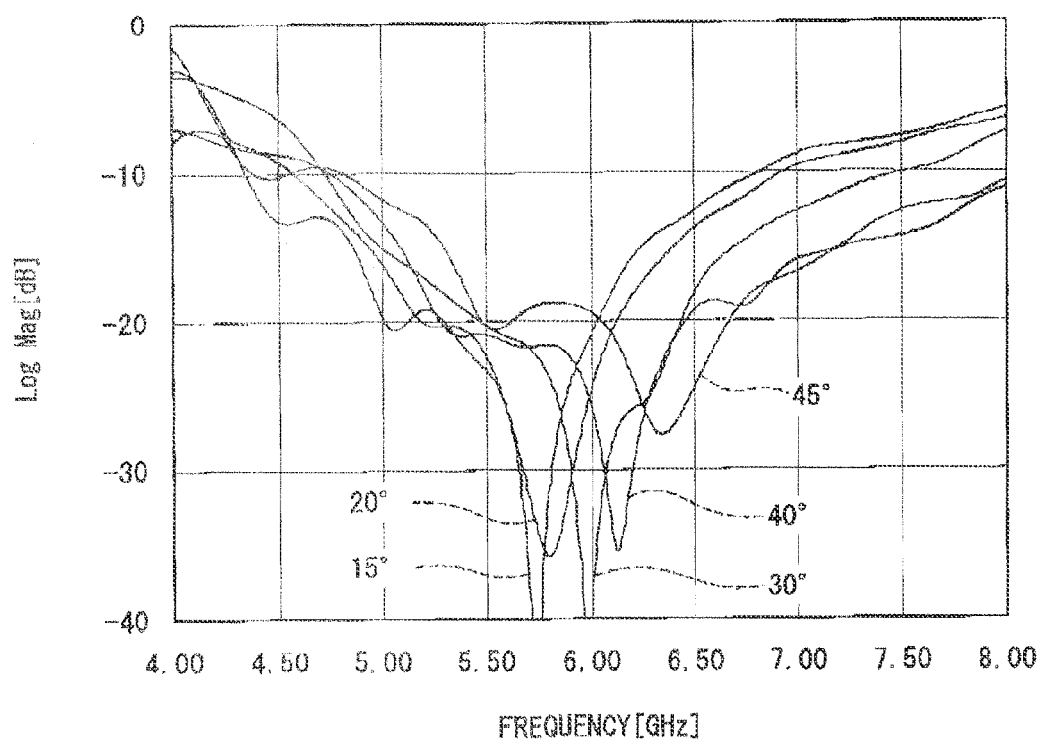
FIG. 17 is a graph showing a wave-absorbing property of the wave absorber illustrated in FIG. 16.

As shown in FIG. 17, it is found that an effective absorption bandwidth is narrow in the conventional λ/4 type wave absorber because property variation according to the incident angle of a radio wave is large. In other words, wave absorbers of the first to fourth embodiments of the present invention can be more thin-sized and reduced in weight than a conventional wave absorber and haves small property variation according to the incident angle. Therefore, a wave absorber of the present invention can have a sufficient property as a wave absorber used in an ETC system and so on.

COMPARATIVE EXAMPLE 3

Hereinafter, differences between a conventional wave absorber (Comparative Example 3) and wave absorbers of the first to fourth embodiments of the present invention will be described referring to FIG. 18 to FIG. 20.

Figure 18:
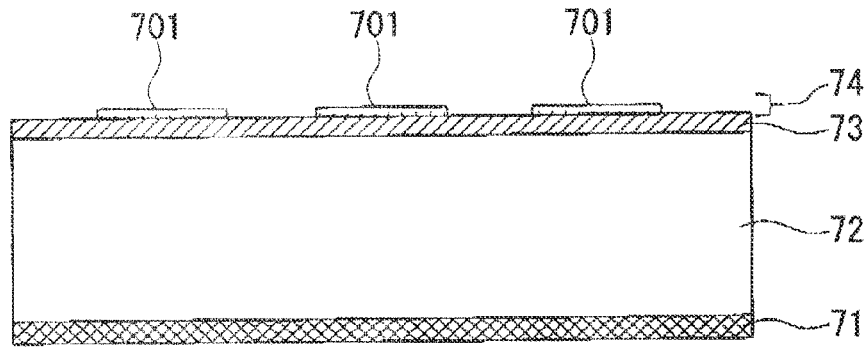
FIG. 18 is a cross-sectional view of a conventional wave absorber (Comparative example 3).

FIG. 18 is a cross-sectional view showing schematic features of a conventional wave absorber (Comparative Example 3). The conventional wave absorber includes a sequentially laminated structure including a conductor layer (71) formed of a copper foil having a thickness of 18 μm; a PC substrate (72) having a thickness of 0.8 mm, which forms a first dielectric layer A, a BT substrate (73) having a thickness of 0.3 mm, which forms a first dielectric layer B; a patterned layer (74) in which a plurality of loop patterns, which is formed of a copper foil and is different with respect to a shape thereof, is placed periodically.

Figure 19:
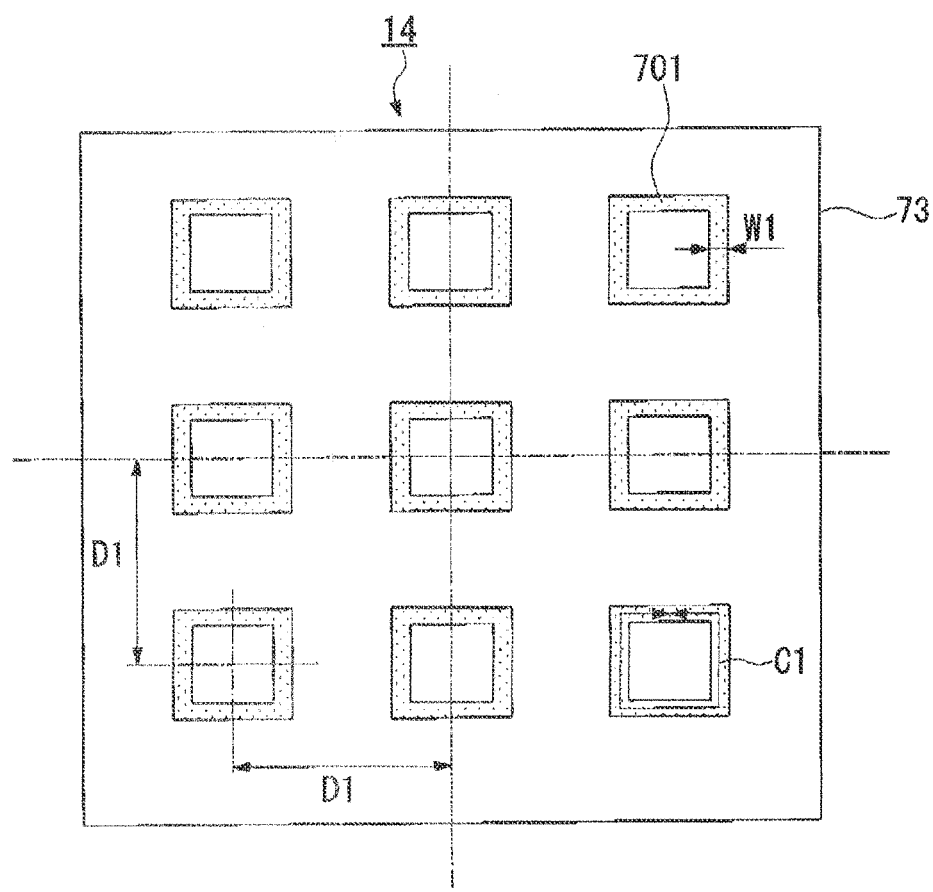
FIG. 19 is a plan view showing details of a patterned layer in the wave absorber illustrated in FIG. 18.

FIG. 19 is a plan view of the conventional wave absorber illustrated in FIG. 18, and shows detailed features of a patterned layer (74). The patterned layer (74) includes a plurality of loop patterns (701) formed on the upper surface of a BT substrate (73). Each of the square-shaped loop patterns (701) has a same shape and a same size. Specifically, each of the square-shaped loop patterns (70) is formed of a copper foil having a thickness of 18 μm and has a central line length (C1) and a line width (W1). The square-shaped loop patterns (701) having the same size are placed with the distance (D1) between centers. The dimension of each part is described in Table 1. Herein, the same production method of a wave absorber and the same measuring method of the wave absorption property thereof as in the first embodiment are used for the conventional wave absorber. FIG. 20 shows the results obtained by measuring the reflection-attenuating amount in this way.

Figure 20:
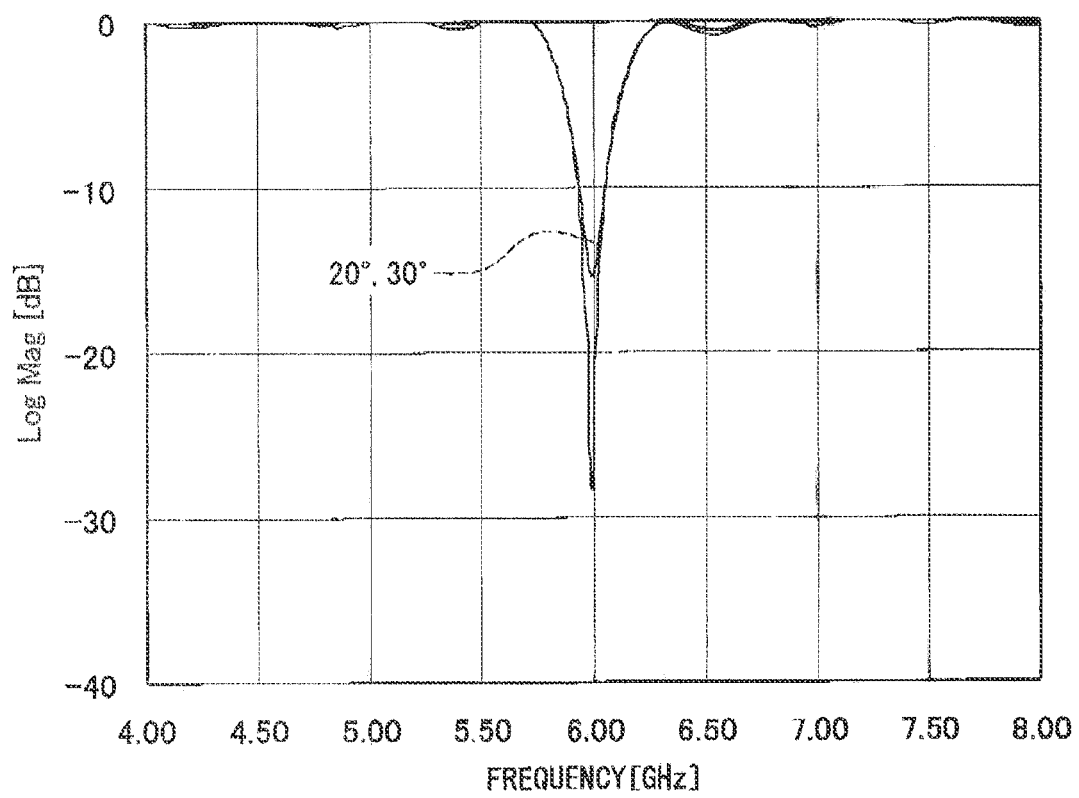
FIG. 20 is a graph showing a wave-absorbing property of the wave absorber illustrated in FIG. 18.

As shown in FIG. 20, it is found that an attenuation property varies according to the incident angle of a radio wave in the wave absorber of Comparative Example 3 although frequency variation is small. Also, it is found that an effective absorption band width is very narrow. In other words, wave absorbers of the first to fourth embodiment of the present invention can be more thin-sized and reduced in weight than a conventional wave absorber and have small property variation according to the incident angle. Therefore, a wave absorber of the present invention can have a sufficient property as a wave absorber used in an ETC system and so on.

TABLE 1

| Length of each part | First embodiment | Second embodiment | Third embodiment | Fourth embodiment | Comparative example 1 | Comparative example 3 |
| --- | --- | --- | --- | --- | --- | --- |
| D1 [mm] | 16.4 | 16.4 | 16.4 | 16.4 | 7.4 | 15.4 |
| D2 [mm] | — | — | 11.5 | 11.5 | — | — |
| C1 [mm] | 36.0 | 33.6 | 36.0 | 36.0 | — | 36.0 |
| C2 [mm] | 32.0 | 29.6 | 32.0 | 32.0 | — | — |
| C3 [mm] | 28.0 | 25.6 | 28.0 | 28.0 | — | — |
| W1 [mm] | 3.7 | 4.4 | 3.7 | 3.7 | — | 1.0 |
| W2 [mm] | 3.7 | 4.4 | 3.7 | 3.7 | — | — |
| W3 [mm] | 3.7 | 4.4 | 3.7 | 3.7 | — | — |
| d1 [mm] | — | — | — | — | 7.0 | — |

While the embodiments of the present invention have been described in detail referring to the drawings as described above, specific features of the present invention should not be restricted by these embodiments. The present invention includes design variations as long as they are not beyond the scope of the present invention. For example, the loop patterns in the patterned layer of wave absorbers of first to fourth embodiments are square-shaped loop patterns, but may be patterns having other shapes such as found-shaped loop patterns or square-shaped patches. Also, a loop pattern may be closed or opened in which a part thereof is disconnected.

Also, in wave absorbers of second to fourth embodiments, all of the dielectric layers are formed of an optically transparent, dielectric material, and a conductive material used in a patterned layer is also an optically transparent ITO material. Also, a pattern in the patterned layer may be formed of a grating-shaped conductive material. When these materials are used, it is possible to form a totally transparent wave absorber and to provide a wave absorber with an excellent aesthetic sense.

INDUSTRIAL APPLICABILITY

The aforementioned embodiments describe the example in which a wave absorber is applied to an ETC system, but the present invention is not restricted by this example and can be applied to applications other than an ETC system. In other words, a frequency and a bandwidth of a radio wave to be absorbed can be changed by adjusting a shape, a size, or a position of the pattern; or a thickness, a surface resistivity, or a material of each layer.

The invention claimed is:

1. A wave absorber comprising: a sequentially laminated structure comprising
a conductor layer formed of a conductive material;
a first dielectric layer formed of one layer or a multilayer of a dielectric material; and
a patterned layer including a plurality of patterns formed of the conductive material, wherein
the pattern in the patterned layer is a loop pattern having a loop shape or a patch pattern having a round shape or a square shape,
each of the patterns in the patterned layer is different from other adjacent patterns with respect to at least one of size and shape, and
a surface resistivity of the conductive material forming the pattern is within 5 Ω/square to 30 Ω/square.

2. A wave absorber according to claim 1, wherein
the pattern in the patterned layer is a loop pattern having a loop shape,
the loop pattern is formed of the conductive material having a shape in which a line width is within 5% to 25% of a central line length which is the length of the central line of the loop pattern,
the central line length of the loop pattern is within 60% to 140% of a wavelength of a radio wave to be absorbed, and
any one of the loop patterns in the patterned layer is different from other adjacent loop patterns to the loop pattern with respect to the central line length and shape.

3. A wave absorber according to claim 1, wherein at least one of the loop patterns and the patch patterns having the round shape or the square shape in the patterned layer has a shape in which a projection is added to a part of the pattern.

4. A wave absorber according to claim 1, wherein an assembly of a plurality of the loop patterns and/or the patch patterns whose shape or size is different to each other constitutes a unit, and the units are allocated such that a spacing between the units is predetermined.

5. A wave absorber according to claim 1, further comprising a second dielectric layer which is laminated on the surface of at least one of the conductor layer and the patterned layer.

6. A wave absorber according to claim 5, wherein
the conductive material used in the conductor layer and the patterned layer is optically transparent, and
the first and second dielectric layers are formed of an optically transparent conductive material.

7. A wave absorber according to claim 5, wherein
the conductor layer is a grating-shaped conductor layer having a grating-shaped pattern,
the conductive material used in the patterned layer is optically transparent, and
the first and second dielectric layers are formed of an optically transparent conductive material.

8. A wave absorber according to claim 1, wherein the conductor layer is a low-resistance conductor layer with a surface resistivity of 30 Ω/square [Ω/□] or less.

9. A wave absorber according to claim 1, wherein the conductor layer is a grating-shaped conductor layer having a grating-shaped pattern.

10. A wave absorber according to claim 9, wherein the grating-shaped conductor layer has a line width of 100 μm or less and a central line spacing of one sixteen of a wavelength of an electromagnetic wave to be absorbed.

* * * * *